(12) United States Patent
Si et al.

(10) Patent No.: US 6,236,257 B1
(45) Date of Patent: May 22, 2001

(54) METHOD AND APPARATUS FOR REDUCING USING FEED FORWARD COMPENSATION

(75) Inventors: Xiaomin Si, San Jose; Jenn-Gang Chern, Redwood Shores, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/164,867

(22) Filed: Oct. 1, 1998

(51) Int. Cl.[7] .......................... H03K 17/16; H03K 17/60
(52) U.S. Cl. .................................. 327/379; 326/26
(58) Field of Search ...................... 327/362, 379, 327/491; 330/292, 295; 326/26, 89

(56) References Cited

U.S. PATENT DOCUMENTS

| | | | |
|---|---|---|---|
| 4,600,847 | * | 7/1986 | Baum ................................. 327/317 |
| 5,189,313 | * | 2/1993 | Garuts ................................ 327/170 |
| 5,477,190 | * | 12/1995 | Brehmer et al. ................... 330/253 |
| 5,514,984 | * | 5/1996 | Nakamura .......................... 326/126 |
| 5,640,112 | * | 6/1997 | Goto et al. ......................... 327/141 |
| 5,760,641 | * | 6/1998 | Granger-Jones et al. .......... 327/553 |

OTHER PUBLICATIONS

Cideciyan, Roy D.; Dolivo, Francois; Hermann, Reto; Hirt, Walter, and Schett, Wolfgang "A PRML System for Digital Magnetic Recording", Jan. 1, 1992, IEEE Journal on Selected Areas in Communications, vol. 10, No. 1.

Rein, H.–M., Möller, M., "Design Considerations for Very- –High-Speed Si–Bipolar IC's Operating up to 50 Gb/s" IEEE Journal of Solid–State Circuits, vol. 31, No. 8, Aug. 1996, pp. 1076–1089.

\* cited by examiner

*Primary Examiner*—Timothy P. Callahan
*Assistant Examiner*—Terry L. Englund

(57) ABSTRACT

An emitter follower circuit with feed forward compensation includes an emitter follower having an emitter follower input and an emitter follower output. An auxiliary emitter follower has an auxiliary emitter follower input and an auxiliary emitter follower output. The emitter follower input is coupled to the auxiliary emitter follower input and the emitter follower output is capacitively coupled to the auxiliary emitter follower output. In this manner, ringing of the emitter follower circuit with feed forward compensation is reduced by the capacitive coupling of the auxiliary emitter follower output to the emitter follower output.

3 Claims, 2 Drawing Sheets

METHOD AND APPARATUS FOR REDUCING USING FEED FORWARD COMPENSATION

BACKGROUND OF THE INVENTION

1. Field of the Invention

The present invention relates generally to analog circuits. More specifically, the invention relates to a clock buffer circuit design that reduces ringing when the buffer is loaded by providing feed forward compensation in an emitter (source) follower circuit.

2. Relationship to the Art

Emitter follower circuits (also referred to as source follower circuits) are used as buffering stages in bipolar (CMOS) technologies because they behave as a low impedance voltage source and the voltage gain is very close to unity. There is, however a problem associated with emitter/source follower circuits. When such a circuit is connected to a capacitive load, the output tends to oscillate or ring. For this reason, emitter/source follower circuits are most useful for applications such as local buffers where ringing with a capacitive load is not a serious problem since the capacitive load is relatively small.

Emitter/source follower circuits are not as well suited to be used as a clock driver because the capacitive load on a clock driving circuit is significant. In high-speed applications such as clock drivers or data buffers, voltage ringing can cause serious problems, such as jitter, reduced noise margin and data dependent noise. The problem becomes most serious when the capacitive load is not linear, i.e., when the capacitive load varies with the clock level. A number of approaches have been devised for solving the problems caused by ringing. One approach is to use a plurality of distributed buffers driven by a master buffer, so that the master buffer and each of the distributed buffers do not individually see a large enough capacitive load to cause ringing to become a problem. Although this approach prevents problems caused by ringing, it also results in higher power dissipation and increased delay.

Another approach to reducing ringing in emitter/source follower circuits caused by capacitive load is to add a resistor in series with the load to damp the oscillation. Adding a resistor to the load, however, causes other problems. As a result of the series resistor, the output may have slower rising/falling edges for transitions.

Other possible approaches such as increasing the follower load current or reducing the source driving impedance have the disadvantage of increasing power consumption. Furthermore, such approaches do not adequately solve the ringing problem.

Another approach has been proposed in "Design Considerations for Very High Speed Si-Bipolar IC's operating up to 50 Gb/s" by H. -M. Rein and M. Moller in IEEE Journal of Solid State Circuits, Vol.31 No. 8, August 1996, which is herein incorporated by reference for all purposes. The approach disclosed attempts to solve the problem of ringing in an emitter follower circuit by a careful individual design of the transistors and reducing their biasing currents. The technique described, however, has the disadvantage of decreasing pulse steepness.

What is needed is a way to solve the problem of ringing for a emitter/source follower circuit when the circuit has a capacitive load so that such a circuit may be used in an application such as a clock buffer. In addition, it is important that such a solution not cause other problems such as drawing too much current or slower rising and falling transition times.

SUMMARY OF THE INVENTION

A feed forward compensation scheme is disclosed that reduces the problem of ringing in an emitter/source follower circuit when connected to a capacitive load. Such a circuit may be effectively used as a clock buffer. In one embodiment, the clock is used to drive an analog to digital converter in an EPRML magnetic disk read channel. The circuit disclosed includes an auxiliary emitter follower stage that is capacitively coupled to a main emitter follower driver. By using this technique, ringing under a capacitive load is substantially reduced, the speed is retained for sharp rising and falling times, and power consumption is not adversely affected.

It should be appreciated that the present invention can be implemented in numerous ways, including as a process, an apparatus, a system, a device, a method, or a computer readable medium. Several inventive embodiments of the present invention are described below.

In one embodiment, an emitter follower circuit with feed forward compensation is disclosed. The circuit includes an emitter follower having an emitter follower input and an emitter follower output. An auxiliary emitter follower has an auxiliary emitter follower input and an auxiliary emitter follower output. The emitter follower input is coupled to the auxiliary emitter follower input and the emitter follower output is capacitively coupled to the auxiliary emitter follower output. In this manner, the ringing of the emitter follower circuit with feed forward compensation is reduced by the capacitive coupling of the auxiliary emitter follower output to the emitter follower output.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Reference will now be made in detail to the preferred embodiment of the invention. An example of the preferred embodiment is illustrated in the accompanying drawings. While the invention will be described in conjunction with that preferred embodiment, it will be understood that it is not intended to limit the invention to one preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
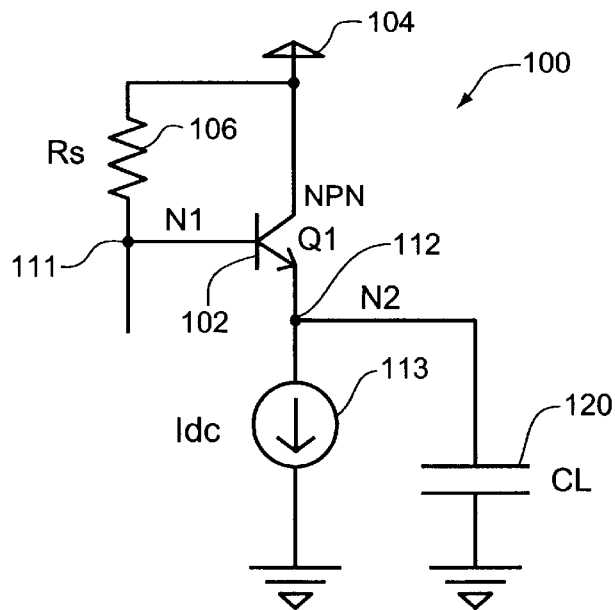
FIG. 1 is a block diagram illustrating an emitter follower driver circuit.

FIG. 1 is a block diagram illustrating an emitter follower driver circuit 100. Emitter follower driver circuit 100 includes a transistor 102. Although a bipolar NPN transistor is shown in this example, it should be noted that other types of transistors may be used as well, e.g., a bipolar PNP, MOSFET (NMOS or PMOS), JFET (N,P), MESFET (GaAs FET's), HBT, etc. A power supply voltage 104 is connected to the collector of transistor 102 and a driving stage resistor 106 is connected between the power supply and the base of transistor 102. A current source 110 is provided between the emitter of transistor 102 and ground. The DC current of the current source, Idc, sets the operating point of the circuit. The input of the circuit is applied at a node 111. The output of the circuit is taken at a node 112 between the emitter and current source 110. A capacitive load 120 is shown at the output. The capacitive load may result from routing trace parasitics or circuits that the emitter/source follower circuits drives.

When the voltage at node 111 changes due to current flowing in driving stage resistor 106, node 112 tends to "follow" node 111. That is, the voltage at node 112 tends to remain equal to the voltage at node 111 minus the biasing voltage of the pn junction between the base and the emitter. However, there is some delay in node 112 following node 111 and, as mentioned above, ringing also tends to occur. The delay may be improved by increasing Idc so that the capacitive load is charged more quickly. However, variation is still a problem and the ringing problem persists. The ringing problem is described further in connection with an emitter follower circuit model that is shown in FIG. 2.

Figure 2:
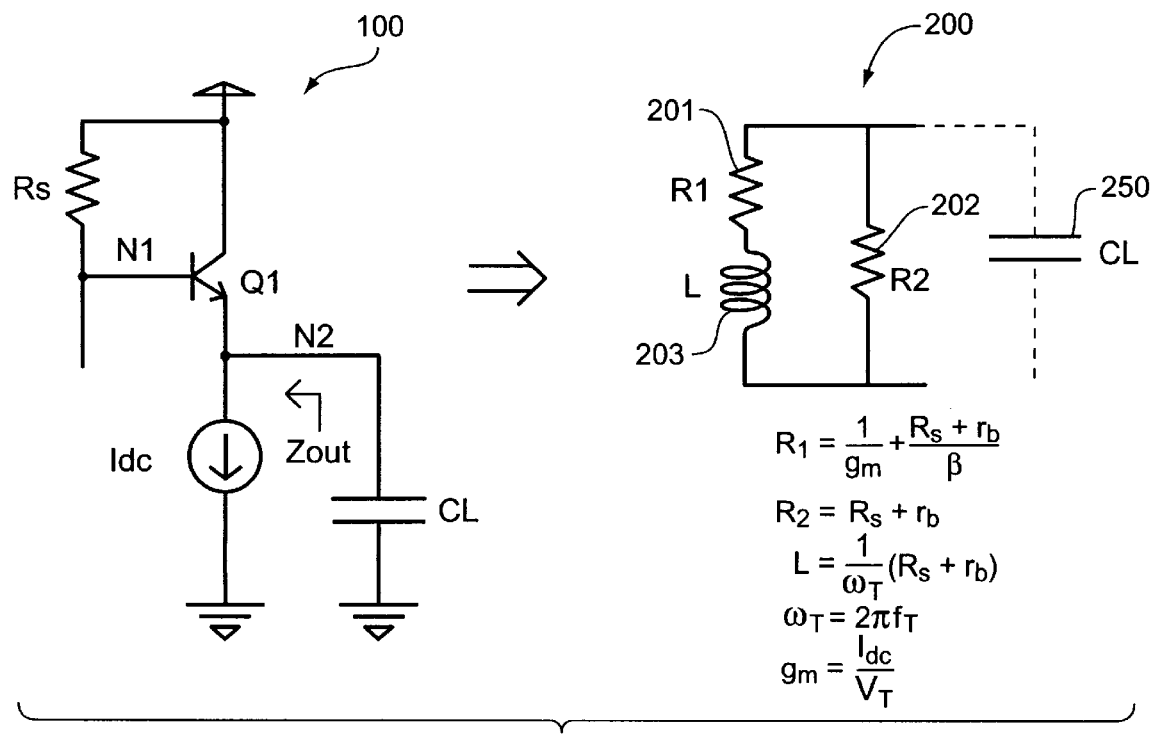
FIG. 2 is a circuit diagram illustrating a model of the emitter follower circuit from FIG. 1 driving a capacitive load.

FIG. 2 is a circuit diagram illustrating a model 200 of the emitter follower circuit 100 from FIG. 1 driving a capacitive load 210. The circuit model includes a resistor 201, a resistor 202, and an inductor 203. The resistance of resistors 201 and 202 are calculated based on the components of the emitter follower circuit using the equations shown, where $V_t$ is the thermal voltage of transistor 102, $\beta$ is the current gain of transistor 102, $\omega_T$ is the current unity gain of the circuit, $f_T$ is the current unity frequency of the circuit, and $g_m$ is the transconductance of the current source. $r_b$ is the extrinsic (or parasitic) resistance in series with the base input. The output impedance of the emitter follower is inductive, and so it tends to resonate with a capacitive load. To reduce the ringing, it would be necessary to reduce the inductance, L. One way to achieve this is to reduce Rs, which could also reduce $\omega_T$. Unfortunately, this also reduces R1, the damping resistor in series with L. The ringing magnitude reduction thus may not be very significant because both the inductance and the damping resistance are reduced, but the ringing frequency is increased. It is commonly believed that increasing Idc can reduce ringing, but, from the equations shown, it is clear that when Idc is increased, R1 is actually reduced while L stays the same. Therefore the ringing is not reduced by increasing Idc.

Figure 3A:
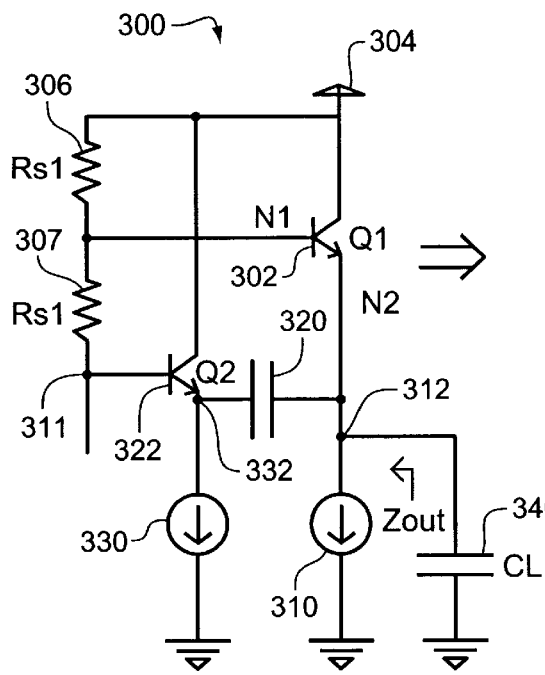
FIG. 3A is a circuit diagram illustrating an emitter follower circuit that includes feed forward compensation provided by an auxiliary emitter follower stage.

FIG. 3A is a circuit diagram illustrating an emitter follower circuit 300 that includes feed forward compensation provided by an auxiliary emitter follower stage. The circuit includes an emitter follower similar to the emitter follower shown in FIG. 1 and includes a transistor 302, a source resistor 306 and a current source 310. The auxiliary emitter follower stage includes a transistor 322, a current source 330, and a source resistor 307. The output of the auxiliary emitter follower stage is at a node 332 that is coupled to the main output taken at a node 312 through a coupling capacitor 320. In one embodiment, the auxiliary current, Idc2 needs only to be about 10% of the main current, Idc1, so the added power required by the auxiliary emitter follower is not excessive. The power of the auxiliary emitter follower stage can be significantly smaller than in the main emitter follower stage because of the larger Rs and the series capacitor, which are chosen so that the resonance frequency is offset from the resonance frequency of the main emitter stage.

Figure 3B:
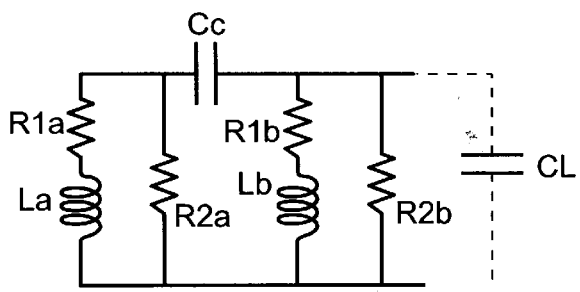
FIG. 3B is a simplified small signal model for the circuit shown in FIG. 3A.

This configuration significantly reduces ringing. The reason why ringing is reduced may be understood by referring to the simplified small signal model for the circuit shown in FIG. 3B. Because the system now contains two inductors, and two capacitors, it has multiple poles and zeros. Using numerical simulations such as SPICE for specific process parameters, it can be shown that the output of the circuit shown in FIG. 3A has two resonance peaks that are smaller than the single resonance peak in the output of the circuit shown in FIG. 2.

As mentioned above, the power required by the auxiliary emitter follower can be lower than the main emitter follower because Rs and the coupling capacitor may be selected both to obtain a different resonance peak and to reduce the current required for the auxiliary emitter follower.

Figure 4:
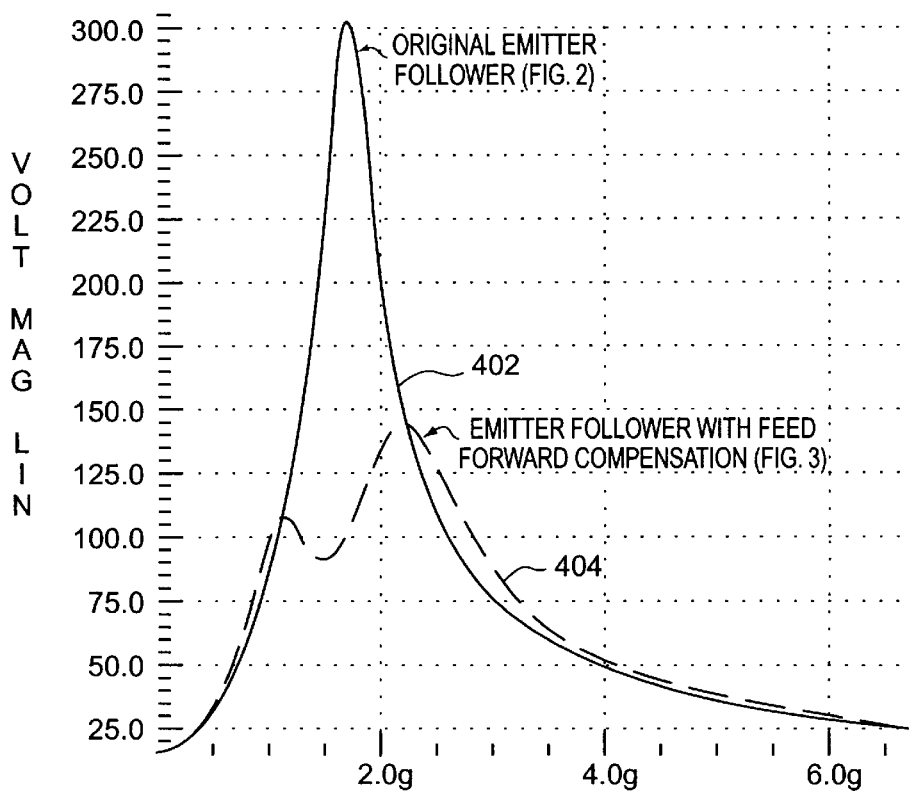
FIG. 4 is a graph plotting the output of an emitter follower circuit with feed forward compensation and an emitter follower circuit without feed forward compensation.

FIG. 4 is a graph plotting the output of an emitter follower circuit with feed forward compensation and an emitter follower circuit without feed forward compensation. The x axis of the plot is the frequency of the input in GHz and the y axis of the plot is the relative magnitude of the ringing at the output. A plot 402 shows the output of the emitter follower circuit without feed forward compensation shown in FIG. 1. The output shows a single resonance peak. A plot 404 shows the output of the emitter follower with feed forward compensation shown in FIG. 3A. The emitter follower circuit with feed forward compensation output has a smeared peak with reduced height due to multiple poles. The ringing is reduced because the resonant response of the circuit is reduced at the two smaller resonant peaks. This implies that the emitter follower with feed forward compensation circuit is less frequency selective than the single emitter follower circuit. Thus, ringing is reduced and the performance of the system is improved without the penalty of decreasing the rise time of the circuit. In addition, relatively little additional power is required.

The same principle described above of connecting an auxiliary emitter follower to the output node of an emitter follower circuit may also be applied to a source follower circuit.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. An emitter follower circuit with feed forward compensation including:

an emitter follower having an emitter follower input and an emitter follower output; and an auxiliary emitter follower having an auxiliary emitter follower input and an auxiliary emitter follower output wherein the emitter follower input is coupled to the auxiliary emitter follower input and the emitter follower output is capacitively coupled to the auxiliary emitter follower output in such a manner that ringing of the emitter follower circuit with feed forward compensation is reduced, wherein the power consumed by the auxiliary emitter follower is less than about 10% of the power consumed by the emitter follower.

2. An emitter follower circuit with feed forward compensation, including:

an emitter follower having an emitter follower input and an emitter follower output; and an auxiliary emitter follower having an auxiliary emitter follower input and an auxiliary emitter follower output, wherein the emitter follower input is coupled to the auxiliary emitter follower input and the emitter follower output is capacitively coupled to the auxiliary emitter follower output, and wherein the power consumed by the auxiliary emitter follower is about 10% of the power consumed by the emitter follower;

whereby ringing of the emitter follower circuit with feed forward compensation is reduced by the capacitive coupling of the auxiliary emitter follower output to the emitter follower output.

3. An emitter follower circuit with feed forward compensation including:

an emitter follower having an emitter follower input and an emitter follower output;

an auxiliary emitter follower having an auxiliary emitter follower input and an auxiliary emitter follower output wherein the emitter follower input is coupled to the auxiliary emitter follower input; and a capacitor coupling the emitter follower output to the auxiliary emitter follower output with no active element interposed between the emitter follower output and the auxiliary emitter follower output;

whereby ringing of the emitter follower circuit with feed forward compensation is reduced by the capacitive coupling of the auxiliary emitter follower output to the emitter follower output.

* * * * *